United States Patent [19]
Farnworth et al.

[11] Patent Number: 5,682,065
[45] Date of Patent: Oct. 28, 1997

[54] HERMETIC CHIP AND METHOD OF MANUFACTURE

[75] Inventors: Warren M. Farnworth, Nampa; Salman Akram; Alan G. Wood, both of Boise, all of Id.

[73] Assignee: Micron Technology, Inc., Boise, Id.

[21] Appl. No.: 614,178

[22] Filed: Mar. 12, 1996

[51] Int. Cl.⁶ .................................................. H07C 27/02
[52] U.S. Cl. .......................... 257/727; 257/794; 257/758; 257/632
[58] Field of Search .......................... 437/226, 227, 437/927, 974; 257/620, 723, 724, 758, 644, 794, 632

[56] References Cited

U.S. PATENT DOCUMENTS

| | | | |
|---|---|---|---|
| 4,749,631 | 6/1988 | Haluska et al. | 428/704 |
| 4,756,977 | 7/1988 | Haluska et al. | 428/704 |
| 4,769,345 | 9/1988 | Butt et al. | 437/217 |
| 4,821,151 | 4/1989 | Pryor et al. | 361/403 |
| 4,866,571 | 9/1989 | Butt | 361/386 |
| 4,967,260 | 10/1990 | Butt | 257/666 |
| 5,014,159 | 5/1991 | Butt | 257/666 |
| 5,128,737 | 7/1992 | Van Der Hase | 257/503 |
| 5,323,051 | 6/1994 | Adams et al. | 257/417 |
| 5,336,928 | 8/1994 | Neugebaer et al. | 257/758 |
| 5,455,459 | 10/1995 | Fillion et al. | 257/760 |
| 5,481,135 | 1/1996 | Chandra et al. | 257/701 |
| 5,497,033 | 3/1996 | Fillion et al. | 257/723 |
| 5,547,906 | 8/1996 | Badehi | 437/227 |

Primary Examiner—Tom Thomas
Assistant Examiner—David B. Hardy
Attorney, Agent, or Firm—Trask, Britt & Rossa

[57] ABSTRACT

A fully hermetically sealed semiconductor chip and its method of manufacture. The semiconductor chip of the present invention is fully hermetically sealed on both sides and the edges thereof through the use of suitable coatings applied thereto, such as glass, to prevent an environmental attack of the semiconductor chip. The fully hermetically sealed semiconductor chip of the present invention does not require the use of a separate package for the hermetic sealing of the chip, thereby reducing the size of such a chip. The method of the manufacture of the semiconductor chip of the present invention provides a simple process for the fully hermetic sealing of both sides and the edges of the semiconductor chip without the use of a separate package.

48 Claims, 8 Drawing Sheets

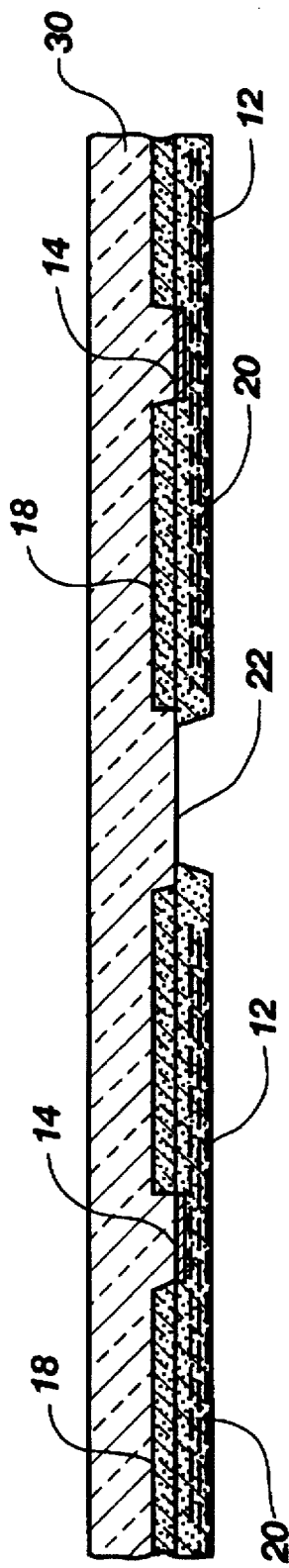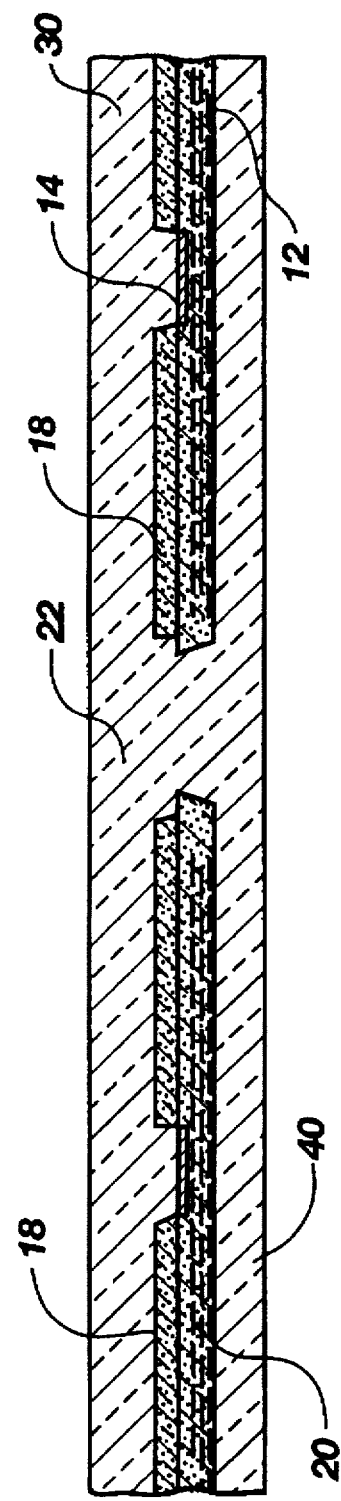

HERMETIC CHIP AND METHOD OF MANUFACTURE

BACKGROUND OF THE INVENTION

1. Field of the Invention

The present invention relates to hermetically sealed semiconductor chips. More specifically, the present invention relates to a fully hermetically sealed semiconductor chip and its method of manufacture.

2. Description of the Related Art

Solid state electronic devices, semiconductor chips, are typically manufactured from a semiconductor material, such as silicon, germanium, or gallium/arsenide. Circuitry is formed on one surface of the device with input and output pads being either formed around the periphery or generally in the center of the device to facilitate electrical connection.

The semiconductor chips are typically packaged to protect the chip from mechanical damage, external contamination, and moisture. Typical semiconductor chip packages may be divided into the broad categories of plastic encapsulated type, quasi-hermetic cavity type and fully hermetic cavity type. While plastic-encapsulation of semiconductor chips is the most common form of packaging chips, the plastic encapsulation allows the chip to be vulnerable to electrochemical processes. The numerous and extensive polymer/metal interfaces in the plastic encapsulated semiconductor package affords ample opportunities for moisture ingress as well as allowing the soluble ions present to provide an electrolyte for the corrosive failure mechanism of the semiconductor chip. Also, the extensive use of precious metals coupled with base metals in chips and packages provides dc galvanic potentials for electrochemical corrosion reactions and dendrite growth, thereby affecting the performance and life of the encapsulated semiconductor chip.

As a result of the problems associated with the plastic encapsulation of semiconductor chips, it is desirable to hermetically package chips to prevent external moisture and chemicals from contacting a chip. Hermetic packages for semiconductor chips generally are of the metal and ceramic material type. The common feature shared by these packages is the use of a lid or a cap to seal the semiconductor device mounted on a suitable substrate. The leads from the lead frame also need to be hermetically sealed. In metal packages, the individual leads are sealed into the metal platform by separated glass seals. In ceramic packages the leads are commonly embedded in the ceramic itself.

Several types of ceramic packages are used to hermetically seal semiconductor chips. Typically, such types of hermetic packages are ceramic dual-in-line package, hard glass package, side-brazed dual-in-line package, bottom-or top-brazed chip carrier, pin-grid array or other multilayer ceramic package. Some of such types of packages are described in U.S. Pat. Nos. 4,769,345, 4,821,151, 4,866,571, 4,967,260, 5,014,159, and 5,323,051.

However, such prior art type hermetically sealed packages for semiconductor chips all use an external package formed around the chip to form the hermetic seal. Such external packages increase the size and cost of the semiconductor chip for installation of the chip with associated circuitry.

While it is well known to attempt to seal semiconductor chip active circuitry at the wafer stage of production by applying a passivation coating to the wafer with ceramic materials such as silica and/or silicone nitride by CVD techniques, the subsequent etching back of the passivation coating at the bond pads of the semiconductor chip damages the passivation coating around the bond pads, thereby affecting the reliability of the chip and shortening the life of the chip from environmental corrosion as such chips are not truly hermetically sealed or considered to be fully hermetically sealed chips.

In an attempt to hermetically seal semiconductor chips without the use of external packages, in U.S. Pat. Nos. 4,756,977 and 4,749,631 it has been suggested to use lightweight ceramic protective coatings on such chips derived from hydrogen silsesquiozane and silicate esters as well as additional ceramic layers as hermetic barriers.

In another attempt to hermetically seal semiconductor chips without the use of external packages, as disclosed in U.S. Pat. No. 5,481,135, when certain ceramic protective coatings, such as those derived from hydrogen silsesquiozane and silicate esters, are applied to the active surface of a semiconductor chip at the wafer level, even though the bond pads are subsequently exposed by removing a portion of the ceramic protective coating, the resultant circuits remain hermetically sealed. However, the use of such ceramic protective coatings applied to the semiconductor chip at the wafer level are applied only to the active circuitry side of the wafer, not both sides of the wafer, nor on the edges of the semiconductor chips. As such, the semiconductor chip is not truly or fully hermetically sealed. At best, only one side of the semiconductor chip may be thought to be hermetically sealed, thereby leaving the other side of the chip unsealed as well as the edges of the chip.

None of the prior art hermetically sealed semiconductor chips described hereinabove are fully hermetically sealed without the use of a separate package, either metal or ceramic. A need exists for a fully hermetically sealed semiconductor chip which is fully hermetically sealed on both sides and the edges thereof without the use of a separate package.

SUMMARY OF THE INVENTION

The present invention relates to hermetically sealed semiconductor chips. More specifically, the present invention relates to a fully hermetically sealed semiconductor chip and its method of manufacture. The semiconductor chip of the present invention is fully hermetically sealed on both sides and the edges thereof through the use of suitable coatings applied thereto, such as glass, to prevent an environmental attack of the semiconductor chip. The fully hermetically sealed semiconductor chip of the present invention does not require the use of a separate package for the hermetic sealing of the chip, thereby reducing the size of such a chip. The method of the manufacture of the semiconductor chip of the present invention provides a simple process for the fully hermetic sealing of both sides and the edges of the semiconductor chip without the use of a separate package.

BRIEF DESCRIPTION OF THE DRAWINGS

The semiconductor chip of the present invention and its method of manufacture will be better understood when the description of the invention is taken in conjunction with the drawings wherein:

FIG. 7 is a partial cross-sectional view of the wafer of semiconductor chips illustrating another portion of the method of the present invention.

FIG. 8 is a partial cross-sectional view of the wafer of semiconductor chips illustrating another portion of the method of the present invention.

DESCRIPTION OF THE INVENTION

Figure 1:
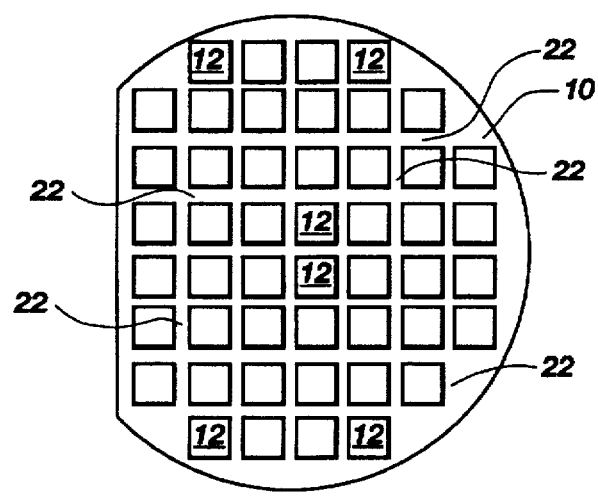
FIG. 1 is a top view of a semiconductor wafer having a plurality of semiconductor chips formed thereon.

Referring to drawing FIG. 1, shown is a wafer 10 having a plurality of semiconductor chips 12 formed thereon. The semiconductor chips 12 each include a suitable passivation layer or layers thereon (not shown) which are well known in the industry to provide protection for the active circuitry on each chip 12. While such passivation layers on areas of each semiconductor chip 12 provide some sealing effect, they are not sufficient to provide a fully hermetically sealed chip 12. As shown, the semiconductor chips 12 have not been separated but remain in the form of a wafer 10 for further processing. When in wafer form, each semiconductor chip 12 is separated on all sides from another chip 12 by a street area 22.

Figure 2:
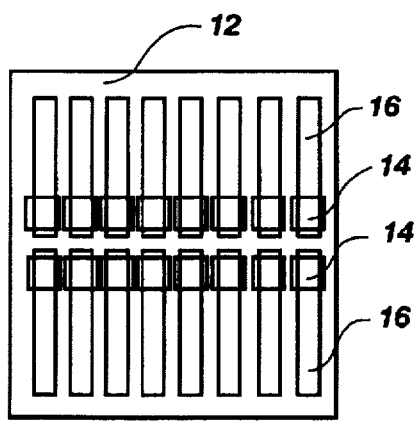
FIG. 2 is a top view of one type of semiconductor chip formed by the method of the present invention.

Referring to drawing FIG. 2, a semiconductor chip 12 having a lead-over-chip configuration is shown having a plurality of bond pads 14 which are, in turn, connected to a plurality of circuits 16 formed on the chip 12, the circuits 16 extending to opposite sides of the chip 12 for subsequent use. The circuits 16 can be used to connect the semiconductor chip 12 through use of a suitable connector (not shown) to a substrate. Alternatively, the bond pads 14 may be connected to a lead frame without the use of the circuits 16.

Figure 3:
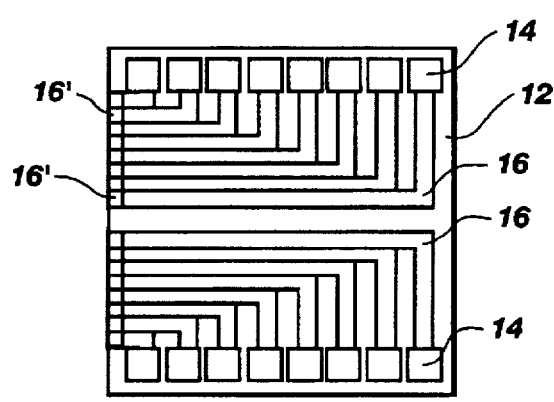
FIG. 3 is a top view of a second type of semiconductor chip formed by the method of the present invention.

Referring to drawing FIG. 3, a semiconductor chip 12 is shown having a plurality of bond pads 14 located about a portion of the periphery of the chip 12 which are, in turn, connected to a plurality of circuits 16 formed on the chip 12. The circuits 16 are used to connect the semiconductor chip 12 through the use of a suitable connector (not shown) to a substrate. The circuits 16 extend to a peripheral edge of the chip 12 and extend around a peripheral edge of the chip as shown at 16' for use with a suitable connector (not shown). Alternatively, the bond pads 14 located on the periphery of the chip 12 may be connected to a conventional type lead frame without the use of the circuits 16.

Figure 4:
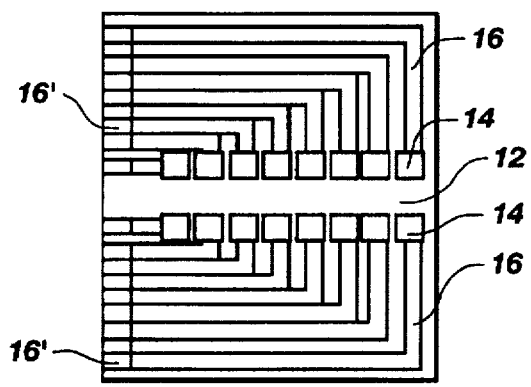
FIG. 4 is a top view of a third type of semiconductor chip formed by the method of the present invention.

Referring to drawing FIG. 4, another lead-over-chip type semiconductor chip 12 is shown having a plurality of bond pads 14 which are, in turn, connected to a plurality of circuits 16 formed on the chip 12 in a configuration that differs from that of the circuits shown on the chip 12 in drawing FIG. 1. As previously stated, the circuits 16 are used to connect the semiconductor chip 12 through use of a suitable connector (not shown) to a substrate. As shown in drawing FIG. 4, the circuits 16 are formed to terminate along one edge of the semiconductor chip 12 for use with a suitable connector and may extend around the edge at 16'. Since the circuits 16 may have any desired configuration on the semiconductor chip 12 and may extend to the edge thereof and, if desired, therearound, the manner in which the chip 12 may be connected to other circuitry offers a wide variety of configurations.

Referring to drawing FIGS. 5 through 10, the method of the present invention of making a substantially fully hermetically sealed semiconductor chip 12 will be generally illustrated with reference to a portion of a wafer 10 having portions of semiconductor chips 12 located thereon. Subsequently with reference to drawing FIGS. 12A, 12B, and 12C, the method of the present invention of making a substantially fully hermetically sealed semiconductor chip 12 will be generally set forth in a flow process diagram illustrating the general steps of the method of the present invention.

Figure 5:
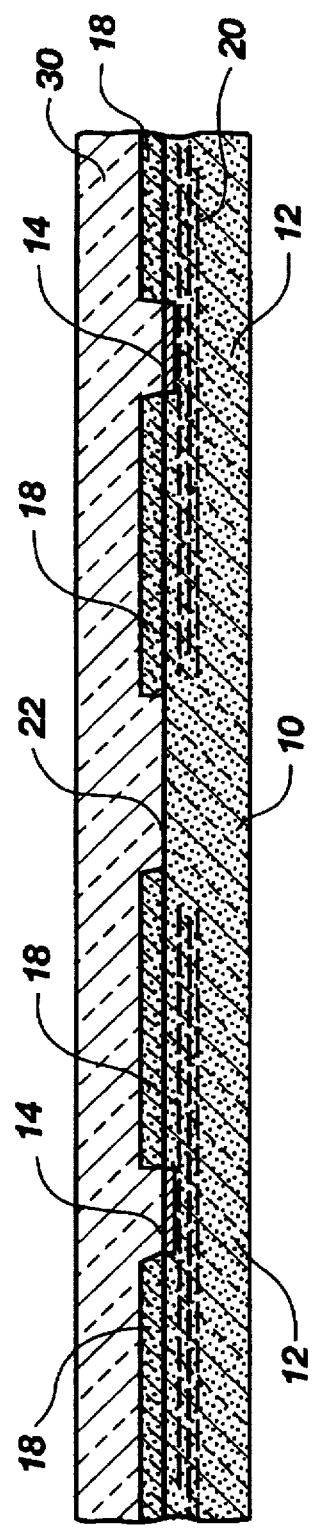
FIG. 5 is a partial cross-sectional view of the wafer of semiconductor chips illustrating a portion of the method of the present invention.

Referring initially to drawing FIG. 5, a portion of a silicon substrate wafer 10 is shown having portions of two semiconductor chips 12 formed thereon, each chip 12 having, in turn, bond pads 14 thereon, passivation layers 18 thereon, circuitry 20 therein, and street areas 22 located between the chips 12 formed on the wafer 10. Initially, while the chips 12 are in the form of a wafer 10, the active circuitry side of the chips 12, i.e., the top or first side of the wafer 10, is coated with a layer 30 of suitable etchable glass of sufficient thickness to cover the wafer 10 in its entirety including the street areas 22 formed between the adjacent chips 12 on the wafer 10 while maintaining the surface of the wafer 10 in a substantially planar state. The layer 30 of etchable glass may be added to the wafer 10 by any suitable well known technique, such as spin coating, dip or flow coating. It is preferable that the etchable glass coating be a type of glass that cures at a relatively low temperature, such as curing at a temperature generally less than six hundred degrees Centigrade (600° C.) and is easily etched in subsequent etching processes. Such types of etchable glasses are well known and may be selected depending upon processing convenience during manufacture.

Figure 6:
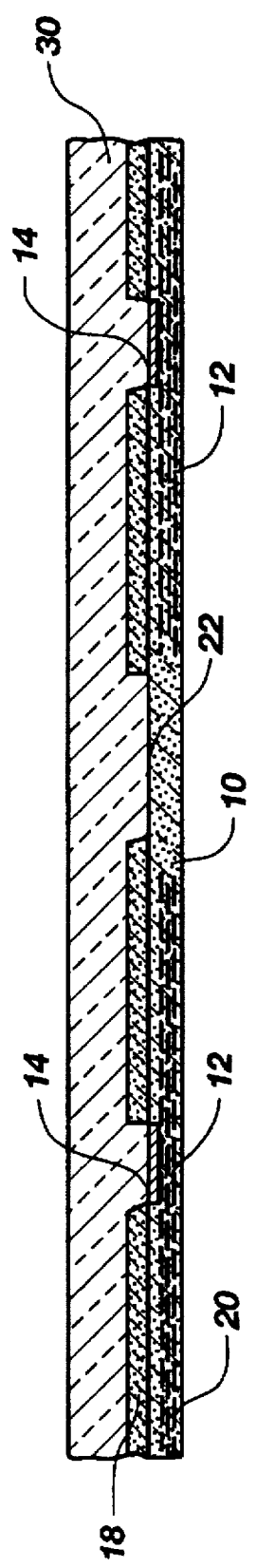
FIG. 6 is a partial cross-sectional view of the wafer of semiconductor chips illustrating another portion of the method of the present invention.

Referring to drawing FIG. 6, the next step in the method of the present invention, which may be considered to be optional, is to reduce the thickness of the wafer 10 by removing a portion of the bottom or second side thereof by any suitable method of processing, such as chemical-mechanical planarization of the wafer 10, mechanical abrasion, etc. Alternatively, if the substrate is sufficiently flat and free of variations in thickness, the wafer 10 need not be reduced in thickness to provide a planar surface on the bottom thereof but is used as is. Also, if the wafer 10 sufficiently thin for subsequent etching therethrough by conventional etching processes, the step of thinning the wafer 10 may be omitted.

Referring to drawing FIG. 7, as shown, in the next step of the method of the present invention, a suitable resist material (not shown) is applied using well known conventional techniques to the bottom or second side of the wafer 10 with the street areas 22 located between the semiconductor chips 12 of the wafer 10 being subsequently etched through to the etchable glass coating 30 applied to the top or first side of the wafer 10. In this manner, the semiconductor chips 12 are separated from each other while being retained in the form of a wafer 10 by the etchable glass coating 30 on the top side of the wafer 10. If hard masking techniques are used to apply the suitable resist material, the resist need not be removed from the back side of the wafer 10 after the wafer 10 is etched through to the glass coating 30. Conversely, if polymeric types of masking techniques are used to apply the suitable resist material, the resist should be removed after the etching of the wafer 10.

Referring to drawing FIG. 8, after the removal of the resist coating, the next step in the method of the present invention is to apply a suitable etchable glass coating 40 to the bottom or second side of the semiconductor chips 12 formed on the wafer 10 to uniformly coat the bottom or second sides of the chips 12 and fill the etched portions of the street areas 22 located between the chips 12 of the wafer 10. The etchable glass coating 40 may be of any suitable material and applied by any suitable manner as described hereinbefore. After the application of the coating 40 of etchable glass to semiconductor chips 12, the chips 12 effectively remain in the form of a wafer 10 by the glass coatings 30 and 40 reforming the wafer 10 by filling the street areas 22 previously etched between the semiconductor chips 12 and coating both the top and bottom, first and second sides, of the wafer 10.

Figure 9:
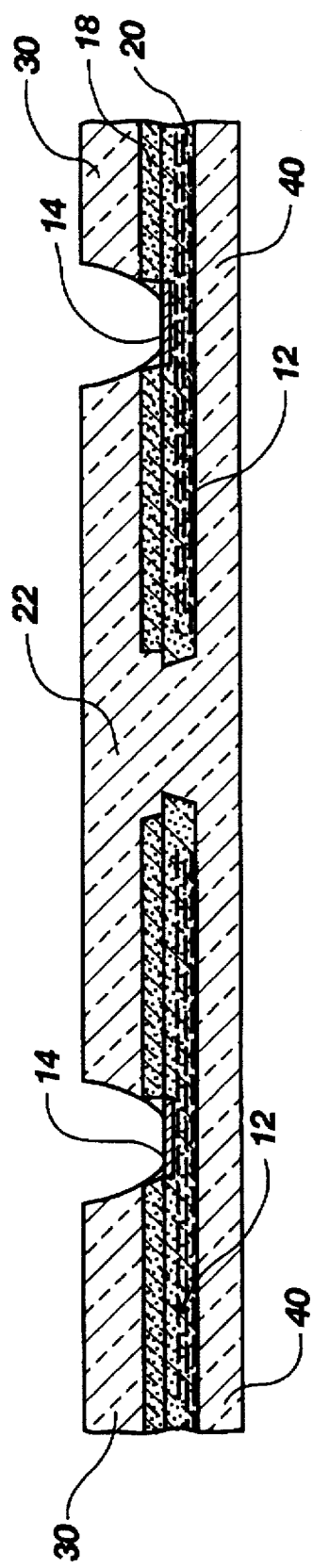
FIG. 9 is a partial cross-sectional view of the wafer of semiconductor chips illustrating another portion of the method of the present invention.

Referring to drawing FIG. 9, the next step of the method of the present invention comprises applying a suitable resist material (not shown) to the glass coating 30 and etching the coating 30 through to expose the bond pads 14 of the semiconductor chips 12. In this manner, the bond pads 14 of the individual semiconductor chips 12 are exposed to have suitable connections made thereto.

Figure 10:
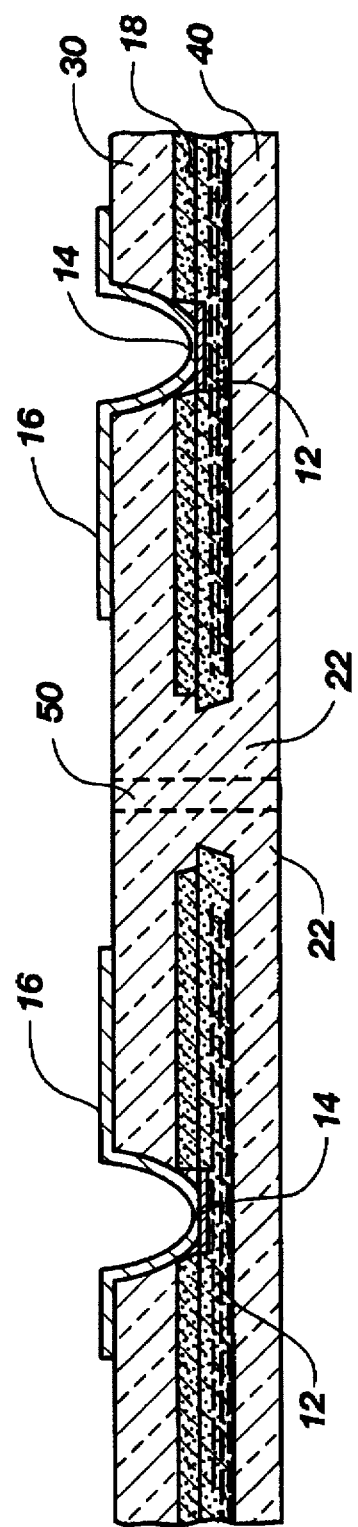
FIG. 10 is a partial cross-sectional view of the wafer of semiconductor chips illustrating another portion of the method of the present invention.

Referring to drawing FIG. 10, the next steps in the method of the present invention are (1) forming a suitable metal coating on the glass coating 30 to substantially hermetically seal the areas of the glass coating 30 etched to expose the bond pads 14 of the semiconductor chips 12 and to form suitable electrical connections to the bond pads 14, (2) applying a suitable resist coating (not shown) to the metal coating on the glass coating 30 having the desired circuitry 16 to connect the bond pads 14 to a predetermined desired connector (not shown), and (3) etching the metal coating to yield the desired circuitry connections 16 (see drawing FIGS. 2 through 4) to the bond pads 14 of each semiconductor chip 12. Subsequent to the circuitry 16 being formed on the surface of the glass coating 30 to form a substantially hermetical seal and to form connections with the bond pads 14 of semiconductor chips 12, the resist coating is removed from the circuits 16 and the individual chips 12 are separated by sawing, severing, dividing or cutting the street areas 22 between each chip 12 as shown at cuts 50. The cuts 50 are made in the street areas 22 so that portions of the glass coatings 30 and 40 remain in substantial contact with each edge of each semiconductor chip 12, thereby substantially hermetically sealing all edges of each chip 12. In this manner, each semiconductor chip 12 is substantially fully hermetically sealed on the top, bottom, and all edges thereof by the glass coatings 30 and 40 and metal circuits 16 connected to bond pads 14, thereby leaving no portion of the semiconductor chip 12 exposed for any environmental attack thereto.

Figure 11:
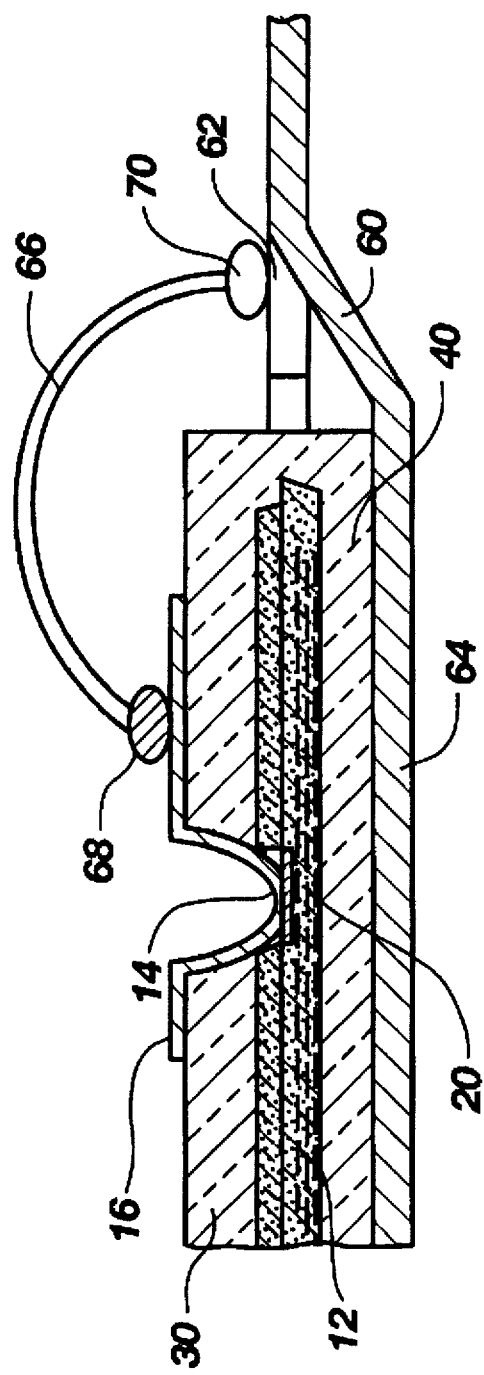
FIG. 11 is a partial cross-sectional view of a semiconductor chip of the present invention connected to a lead of a lead frame.

Referring to drawing FIG. 11, shown connected to a conventional lead frame 60 is a portion of a semiconductor chip 12 substantially fully hermetically sealed on the top thereof by glass layer 30, on the bottom thereof by glass layer 40, and all edges thereof by the combination of the glass layers 30 and 40. As shown, a bond pad 14 having circuitry 16 connected thereto and substantially hermetically sealing the same is connected to a lead 62 of the conventional lead frame 60 by a suitable wire connection 66 having one end thereof 68 connected to the circuitry 16 connected, in turn, to bond pad 14 of chip 12, while the other end 70 of the wire 66 is connected to the lead 62 of conventional lead frame 60. The semiconductor chip 12 is secured to or mounted on the paddle 64 of the conventional lead frame 60. Alternatively, the lead 62 of the lead frame 60 may extend over (not shown) the semiconductor chip 12 for a typical lead-over-chip arrangement well known in the art with the wires 66 attaching the circuitry 16 to the lead 62 in such a manner.

Figure 12A:
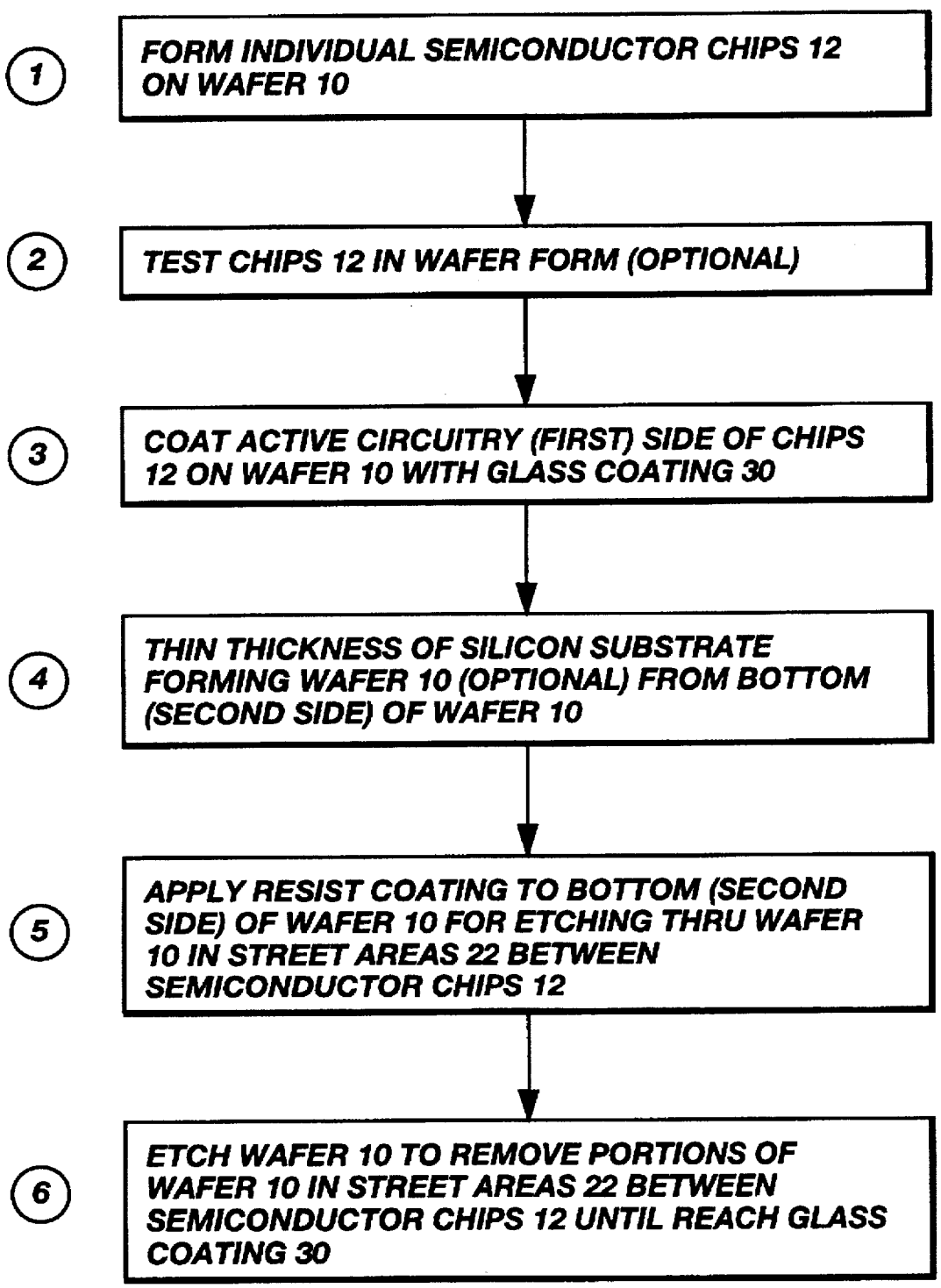
FIG. 12A is a portion of a flow chart illustrating the steps of the present invention.
Figure 12B:
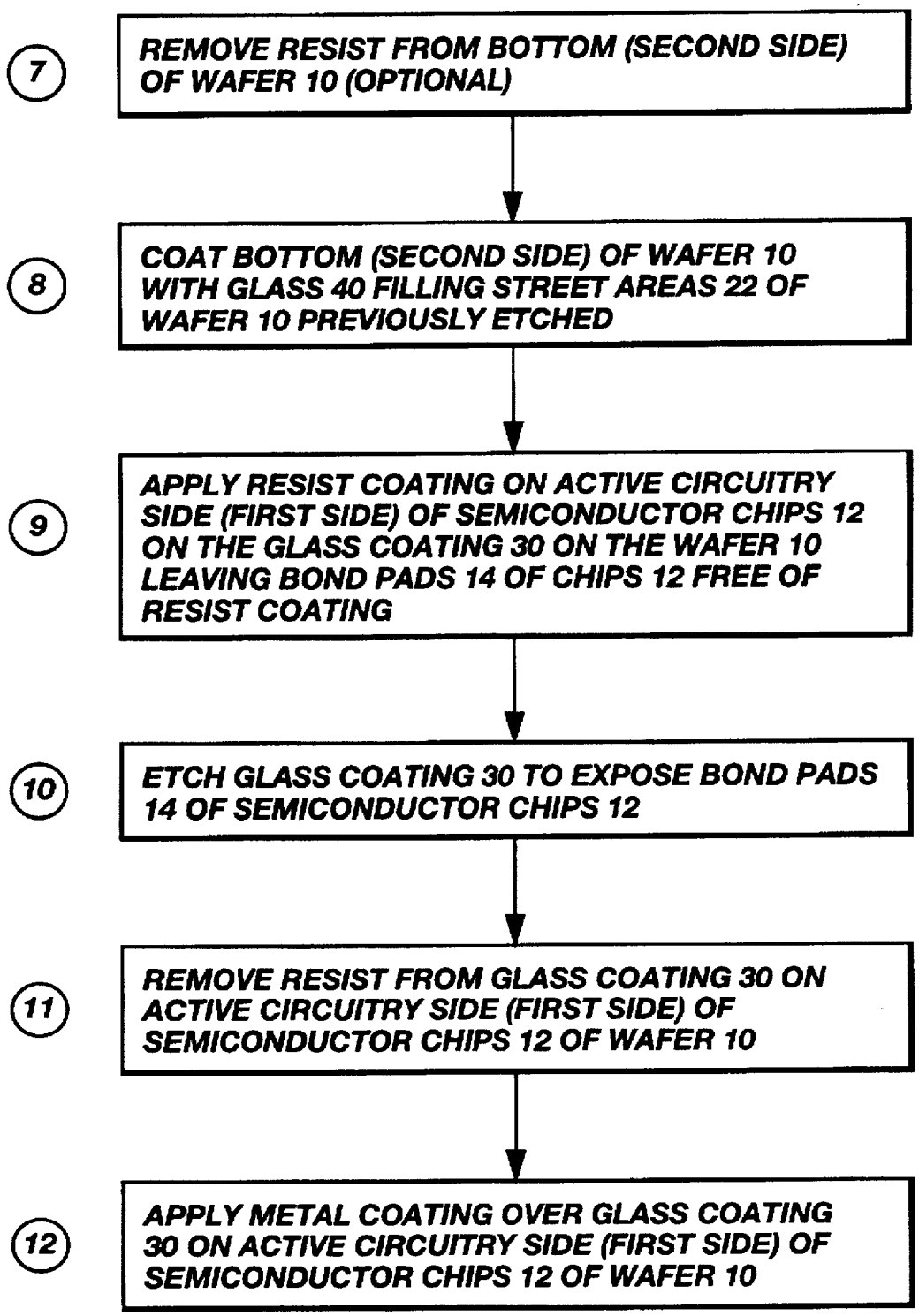
FIG. 12B is a portion of a flow chart illustrating the steps of the present invention.
Figure 12C:
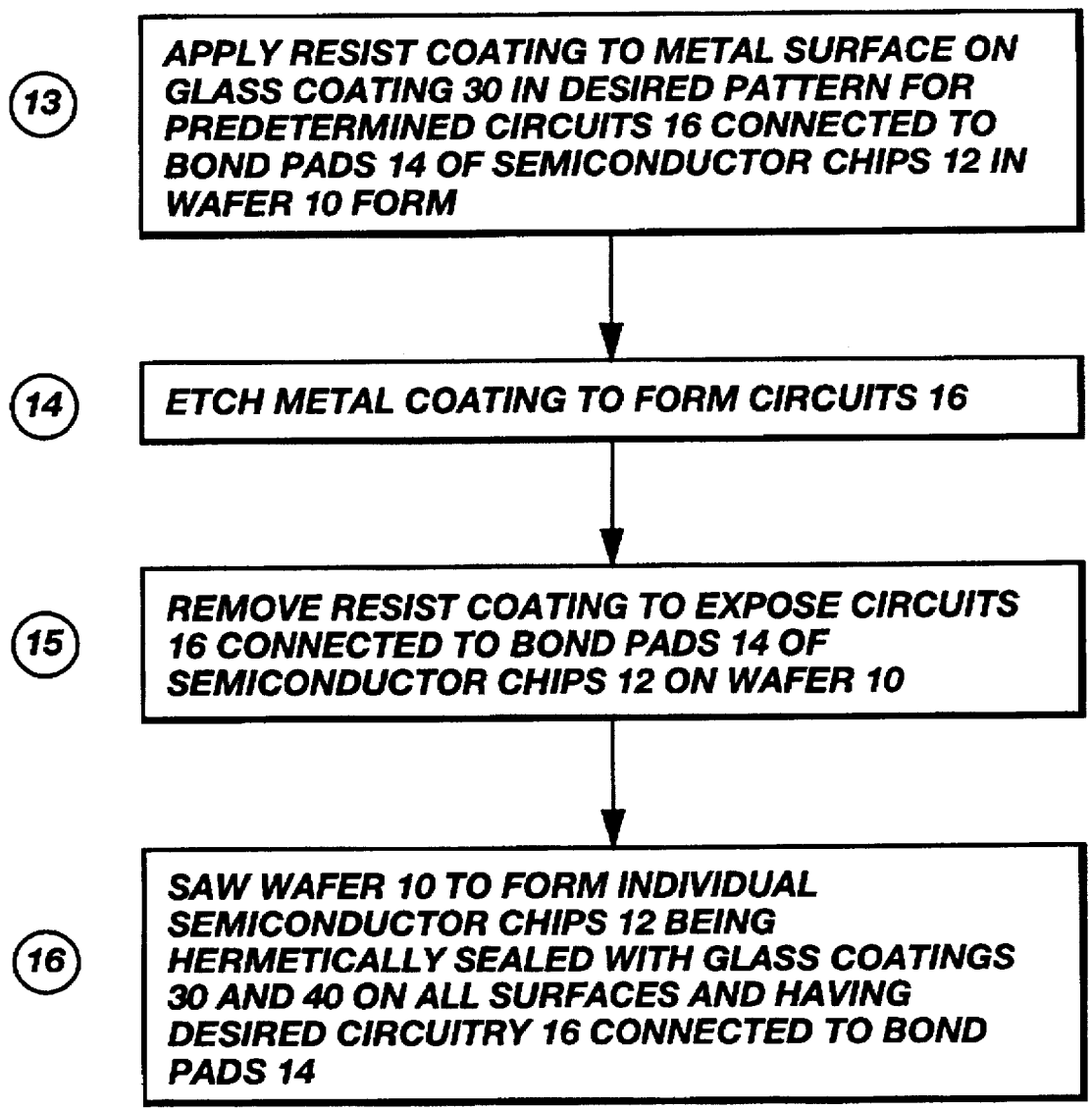
FIG. 12C is a portion of a flow chart illustrating the steps of the present invention.

Referring to drawing FIGS. 12A, 12B and 12C, the steps of the method of the present invention of making a substantially fully hermetically sealed semiconductor chip 10 are shown in flow process form corresponding to such steps being previously described with reference to drawing FIGS. 5-10. In a flow process form, the method of the present invention of making a substantially fully hermetically sealed semiconductor chip 12 generally comprises the following sixteen (16) steps. The method of the present invention substantially begins by forming the desired individual semiconductor chips 12 on a wafer 10. If desired, the individual semiconductor chips 12 are tested for functionality while on the wafer 10. This step is shown as being optional.

The third step of the present invention occurs when the active circuitry side of the semiconductor chips 12, while still in the form of a wafer 10, is coated with a suitable etchable glass coating 30. As previously stated, the etchable glass coating 30 may be of any desired suitable glass, preferably an etchable glass which cures at a relatively low temperature during processing, such as at a temperature of less than six hundred degrees Centigrade (600° C.).

The fourth step of the present invention comprises another optional step where the thickness of the wafer 10 is thinned to provide an even planar surface. The wafer 10 may be thinned from the bottom or second side thereof by any suitable means, such as chemical-mechanical planarization, mechanical abrading, etc. While such thinning is desired, it may not be necessary if the wafer 10 has a sufficiently planar lower surface. Also, if the wafer 10 is sufficiently thin to be etched by conventional etching techniques in the steps of the present invention described hereinafter, the wafer 10 need not be thinned.

As the fifth step in the method of the present invention, a coating of suitable resist material is applied to the lower surface of the wafer 10 so that a portion of the street areas 22 located between the individual semiconductor chips 12 on the wafer 10 may be subsequently etched therethrough to the glass coating 30 on the top of the wafer 10. Any suitable resist material may be used for such an etching process, depending upon the desired process parameters.

As the sixth step of the present invention, after the resist coating has been applied to the bottom of the wafer 10 and cured, portions of the street areas 22 located between the semiconductor chips 12 of the wafer 10 are etched therethrough until the wafer 10 has been substantially etched through to the glass coating 30 applied to the active circuitry side (top or first side) of the wafer 10 with care being taken not to substantially etch through the glass coating 30. Any suitable etching process may be used, depending upon the material from which the wafer 10 is formed, such etching processes being well known in the art.

The seventh step of the present invention is optional, depending upon the type of resist material applied to the wafer 10. If hard resist masking techniques are used, the resist need not be removed from the back of the wafer 10. If polymeric resist masking techniques are used, the resist should be removed from the bottom or second side of the wafer 10.

As the eighth step of the present invention, the bottom or second side of the wafer 10 is next coated with a suitable glass coating 40 to cover the bottom or second side of the wafer 10 and fill the previously etched portions of the street areas 22 located between the plurality of semiconductor chips 12 of the wafer 10. Any suitable glass coating may be used for such coating of the wafer 10 to provide a uniform, planar coating of glass on the bottom of the wafer 10. The glass coating 40 must extend through the portions of the street areas 22 previously etched, thereby contacting the glass coating 30 to form an area of glass replacing the portions of the wafer 10 which have been etched away. In this manner, the wafer 10 has effectively been reformed or recreated by the glass coatings 30 and 40 filling the portions of the street areas 22 etched away.

The ninth step of the method of the present invention comprises applying a coating of suitable resist material on the active circuitry side (top or first side) of the semiconductor chips 12 over the glass coating 30 on the wafer 10, leaving the bond pad areas 14 of the chips 12 free of resist material. Any suitable resist material may be used, depending upon the desired process parameters of the etching process to be used.

As the tenth step of the method of the present invention, subsequent to applying the resist coating over the glass coating 30, the glass coating 30 is etched through to uncover predetermined bond pad areas 14 of each semiconductor chip 12 of the wafer 10. Any suitable etching process may be used, depending upon the type of glass coating 30 applied to the active circuitry side of the wafer 10.

As the eleventh step of the method of the present invention, after etching the glass coating 30, over the bond pads 14 of the semiconductor chips 12, the resist coating is removed from the glass coating 30 leaving the bond pads 14 exposed.

As the twelfth step of the method of the present invention, the glass coating 30 and exposed bond pads 14 of the semiconductor chips 12 are coated with a suitable metal coating which is compatible with the metal of the bond pads 14 of the chips 12. If desired, before the bond pads 14 are coated with a metal coating, the bond pads 14 may have a diffusion barrier metal layer applied thereto followed by the application of the metal coating. The diffusion barrier metal layer may be applied by well known techniques and may be any suitable metal such as tungsten or metal alloys such as titanium-tungsten, titanium nitride, and the like. The metal coating may be applied by any suitable technique to the glass coating 30 and bond pads 14, such as by sputtering, etc. In this manner, the metal coating substantially hermetically seals the bond pads 14 of the semiconductor chips 12 and forms electrical contact therewith.

As the thirteenth step of the method of the present invention, a coating of suitable resist material is applied to the metal coating applied over the glass coating 30 of the semiconductor chips 12 of the wafer 10 with the resist material applied in the desired pattern to etch away the metal coating in the areas where circuit paths 16 are not desired for connection to the bond pads 14 of each semiconductor chip 12. Examples of such circuits 16 remaining after the etching of the metal coating applied to the glass coating 30 and bond pads 14 are shown in drawing FIGS. 2 through 4 hereinabove previously described.

As the fourteenth step of the method of the present invention, after the resist coating has been applied in the desired paths for circuits 16, the metal coating is etched using a suitable etching process to form the circuits 16 extending from each bond pad 14 of each semiconductor chip 12 thereover to the desired location thereon.

As the fifteenth step of the method of the present invention, the resist material is then removed from the metal coating on the glass coating 40 on the semiconductor chips 12 of the wafer 10 to expose the circuits 16 electrically connected to and hermetically sealing the bond pads 14 of the chips 12.

As the sixteenth step of the method of the present invention, portions of the street areas 22 located between the semiconductor chips 12 of the wafer 10 are sawed through at locations 50 in the street areas 22 so that glass coatings 30 and 40 are maintained on the edges of each semiconductor chip 12 and the active circuitry (top or first) side of the chip 12, and the bottom (second side) of the chip 12 thereby substantially hermetically sealing the chip 12 in glass while the bond pads 14 are substantially hermetically sealed by the metal coating forming the desired circuits 16 connected thereto. In this manner a plurality of semiconductor chips 12 have been formed with each chip 12 being substantially fully hermetically sealed on each side thereof and on each edge thereof and the bond pads 14 being substantially hermetically sealed by the metal coating forming the circuits 16 to prevent environmental corrosion thereof without the use of a separate package. By using the method of the present invention to substantially fully hermetically seal the semiconductor chip 12, without the use of a separate package, the chip 12 of the present invention is of minimum size and occupies a minimum volume. Also, the semiconductor chip 12 formed by the method of the present invention has a desired configuration of circuitry connecting the bond pads 14 of the chip 12 to a desired connector configuration which may include conventional lead frames 60 or lead-over-chip frames. If connected to lead frames, the semiconductor chip 12 of the present invention which is fully hermetically sealed in glass coatings 30 and 40 may be subsequently packaged in suitable plastic materials in a conventional manner for further protection from damage. If desired, since the semiconductor chips 12 are substantially fully hermetically sealed by glass coating 30, having the desired circuitry 16 thereon, and glass coating 40, the chips 12 may be directly inserted into mating connectors which match the circuitry formed on the chips 12.

Additionally, while the circuits 16 have been shown formed on the active circuitry side of the semiconductor chip 12, the circuits may be formed in any desired pattern extending over an edge or edges of the chip 12 to facilitate conventional lead frames, lead-over-chip frames or any desired connector for use therewith.

Furthermore, the circuits 16 may simply be formed over the bond pads 14 of the semiconductor chip 12 and overcoated with solder and have solder balls stencilled thereon for use in a flip-chip configuration to be reflowed to connect the chip 12 to a substrate. Similarly, the circuits 16 can be solder masked and the solder reflowed to attach the semiconductor chip 12 to a substrate having a desired configuration. As shown, the semiconductor chips 12 may have wires bonded to the circuits 16 by way of conventional ball type wire bonding or wedge type wire bonding techniques.

Additionally, since the semiconductor chips 12 are substantially fully hermetically sealed having suitable circuitry 16 formed thereon, the chips 12 are easily tested in their final form for determining if the individual chips 12 are known-good-die ready for use.

From the foregoing it can be seen that changes, additions, deletions, and modifications can be made to the semiconductor chip of the present invention and the method of making thereof which will fall within the scope of the present invention.

What is claimed is:

1. A semiconductor wafer having a plurality of semiconductor devices formed thereon, said wafer comprising:
   a semiconductor wafer substrate having a first side, a second side, a peripheral edge, and a plurality of street areas thereon forming areas therebetween on the semiconductor substrate, the semiconductor wafer substrate having portions thereof removed in the plurality of street areas thereof;
   a plurality of semiconductor devices formed on the first side of the semiconductor wafer substrate in the areas formed therebetween by the plurality of street areas on the semiconductor wafer substrate, each semiconductor device separated from an adjacent semiconductor device by the portions of the semiconductor wafer substrate removed from the street areas of the semiconductor wafer substrate, each semiconductor device having at least one bond pad formed thereon and a plurality of peripheral edges formed by the portions of the semiconductor wafer substrate removed in the plurality of street areas;
   a first coating covering the first side of the semiconductor wafer substrate and the plurality of semiconductor devices formed on the first side of the semiconductor wafer substrate; and
   a second coating covering the second side of the semiconductor wafer substrate and substantially filling the portions of the street areas of the semiconductor wafer substrate which have been removed thereby separating areas of the semiconductor wafer substrate from other areas thereof.

2. The semiconductor wafer of claim 1, wherein the first coating further comprises:
   a coating on the first side of the semiconductor wafer substrate covering the plurality of semiconductor devices formed thereon except for the at least one bond pad formed on each semiconductor device.

3. The semiconductor wafer of claim 2, further comprising:
   a plurality of metal circuits located on the first coating on the first side of the semiconductor wafer substrate, at least one of the plurality of metal circuits being connected to the at least one bond pad of each semiconductor device.

4. The semiconductor wafer of claim 3, wherein the plurality of metal circuits further comprise:
   a plurality of metal circuits located on the first coating on the first side of the semiconductor wafer substrate, at least one of the plurality of metal circuits being connected to the at least one bond pad of each semiconductor device, the at least one metal circuit connected to the at least one bond pad of each of the semiconductor devices engaging the bond pad to which it is connected and engaging the first coating on the first side of the semiconductor wafer substrate located around the at least one bond pad of each semiconductor device.

5. The semiconductor wafer of claim 4, wherein the plurality of metal circuits further comprise:
   the at least one metal circuit connected to the at least one bond pad of each of the semiconductor devices substantially sealingly engaging the bond pad to which it is connected and substantially sealingly engaging the first coating on the first side of the semiconductor wafer substrate located around the at least one bond pad of each semiconductor device.

6. The semiconductor of claim 4, wherein the plurality of metal circuits further comprise:
   the at least on metal circuit connected to the at least one bond pad of each of the semiconductor devices substantially hermetically sealingly engaging the bond pad to which it is connected and substantially hermetically sealingly engaging the first coating on the first side of the semiconductor wafer substrate located around the at least one bond pad of each semiconductor device.

7. The semiconductor wafer of claim 1, wherein the second coating further comprises:
   a coating engaging the plurality of peripheral edges of each semiconductor device.

8. The semiconductor wafer of claim 7, further comprising:
   a plurality of metal circuits located on the first coating on the first side of the semiconductor wafer substrate, at least one of the plurality of metal circuits being connected to the at least one bond pad of each semiconductor device.

9. The semiconductor wafer of claim 8, wherein the plurality of metal circuits further comprise:
   the at least on metal circuit connected to the at least one bond pad of each of the semiconductor devices engaging the bond pad to which it is connected and engaging the first coating on the first side of the semiconductor wafer substrate located around the at least one bond pad of each semiconductor device.

10. The semiconductor wafer of claim 1, wherein the second coating further comprises:
    a coating substantially sealing engaging the plurality of peripheral edges of each semiconductor device formed by the removal of portions of the street areas of the semiconductor wafer substrate.

11. The semiconductor wafer of claim 1, wherein the second coating further comprises:
    a coating substantially hermetically sealingly engaging the plurality of peripheral edges of each semiconductor device formed by the removal of portions of the street areas of the semiconductor wafer substrate.

12. A semiconductor wafer having a plurality of semiconductor devices formed thereon, said wafer comprising:
    a semiconductor wafer substrate having a first side, a second side, and a peripheral edge;
    a plurality of semiconductor devices formed on the first side of the semiconductor wafer substrate, each semiconductor device separated from an adjacent semiconductor device by a street area extending therefrom over a portion Of the semiconductor wafer substrate, each semiconductor device having at least one bond pad formed thereon;
    a first coating covering the first side of the semiconductor wafer substrate and the plurality of semiconductor devices formed on the first side of the semiconductor wafer substrate, the first coating comprising a glass coating; and
    a second coating covering the second side of the semiconductor wafer substrate.

13. A semiconductor wafer having a plurality of semiconductor devices formed thereon, said wafer comprising:
- a semiconductor wafer substrate having a first side, a second side, and a peripheral edge;
- a plurality of semiconductor devices formed on the first side of the semiconductor wafer substrate, each semiconductor device separated from an adjacent semiconductor device by a street area extending therefrom over a portion of the semiconductor wafer substrate, each semiconductor device having at least one bond pad formed thereon;
- a first coating coveting the first side of the semiconductor wafer substrate and the plurality of semiconductor devices formed on the first side of the semiconductor wafer substrate; and
- a second coating covering the second side of the semiconductor wafer substrate, the second coating comprising a glass coating.

14. A semiconductor wafer having a plurality of semiconductor devices formed thereon, said wafer comprising:
- a semiconductor wafer substrate having a first side, a second side, a peripheral edge, and a plurality of street areas thereon forming areas therebetween on the semiconductor wafer substrate, the semiconductor wafer substrate having portions thereof removed in the plurality of street areas thereof;
- a plurality of semiconductor devices formed on the first side of the semiconductor wafer substrate, each semiconductor device separated from an adjacent semiconductor device by a street area extending over a portion of the semiconductor wafer substrate, each semiconductor device formed on the semiconductor wafer substrate being separated from an adjacent semiconductor device by the portions of the semiconductor wafer substrate removed from the street areas of the semiconductor wafer substrate, each semiconductor device having a plurality of peripheral edges formed by the portions of the semiconductor wafer substrate removed in the plurality of street areas and having at least one bond pad formed thereon;
- a first coating covering the first side of the semiconductor wafer substrate and the plurality of semiconductor devices formed on the first side of the semiconductor wafer substrate; and
- a second coating covering the second side of the semiconductor wafer substrate and substantially filling the portions of the street areas of the semiconductor wafer substrate which have been removed thereby separating areas of the semiconductor wafer substrate from other areas thereof.

15. The semiconductor wafer of claim 14, wherein the first coating further comprises:
- a coating on the first side of the semiconductor wafer substrate covering the plurality of semiconductor devices formed thereon except for the at least one bond pad formed on each semiconductor device.

16. The semiconductor wafer of claim 15, further comprising:
- a plurality of metal circuits located on the first coating on the first side of the semiconductor wafer substrate, at least one of the plurality of metal circuits being connected to the at least one bond pad of each semiconductor device.

17. The semiconductor wafer of claim 16, wherein the plurality of metal circuits further comprise:

the at least one metal circuit connected to the at least one bond pad of each of the semiconductor devices engaging the bond pad to which it is connected and engaging the first coating on the first side of the semiconductor wafer substrate located around the at least one bond pad of each semiconductor device.

18. A method of making sealed semiconductor chips, said method comprising the steps of:
- forming at least one semiconductor device on the rest side of a wafer substrate having a first side and second side, the semiconductor device having a plurality of sides and at least one bond pad thereon;
- coating the first side of the wafer substrate with a first coating to substantially seal the at least one semiconductor device formed on the first side of the wafer substrate;
- coating the second side of the wafer substrate with a second coating to substantially seal the second side of the wafer substrate; and
- removing a portion of the wafer substrate from each side of the at least one semiconductor device formed on the wafer substrate prior to the coating of the second side of the wafer substrate.

19. The method of claim 18, further comprising the step of:
- removing a portion of the first coating on the first side of the wafer substrate to uncover a portion of the at least one bond pad located on the at least one semiconductor device.

20. The method of claim 19, further comprising the step of:
- applying a third coating to the uncovered portion of the at least one bond pad of the at least one semiconductor device.

21. The method of claim 19, further comprising the step of:
- applying a third coating to the uncovered portion of the at least one bond pad of the at least one semiconductor device and a portion of the first coating adjacent the at least one bond pad of the semiconductor device.

22. A method of making a sealed semiconductor device, said method comprising the steps of:
- forming at least one semiconductor device on the first side of a wafer substrate having a first side and second side, the semiconductor device having a plurality of sides and at least one bond pad thereon;
- coating the first side of the wafer substrate with a first coating to substantially seal the at least one semiconductor device formed on the first side of the wafer substrate;
- removing a portion of the wafer substrate from each side of the at least one semiconductor device formed on the wafer substrate; and
- removing a portion of the first coating on the first side of the wafer substrate to uncover a portion of the at least one bond pad of the semiconductor device.

23. The method of claim 22, wherein the step of removing a portion of the wafer substrate comprises:
- the portion of the wafer substrate removed from each side of the at least one semiconductor device substantially extending from the second side of the wafer substrate to substantially the first coating on the first side of the wafer substrate.

24. The method of claim 22, further comprising the step of:

coating the second side of the wafer substrate with a second coating to substantially seal the second side of the wafer substrate.

25. The method of claim 24, further comprising the step of:

separating the semiconductor device from the wafer substrate by removing a portion of the second coating substantially extending into the areas of the wafer substrate removed from each side of the semiconductor device.

26. The method of claim 22, further comprising the step of:

coating the second side of the wafer substrate with a second coating to substantially seal the second side of the wafer substrate, the second coating substantially extending into the portions of the wafer substrate removed from the sides of the semiconductor device.

27. The method of claim 26, further comprising the step of:

separating the semiconductor device from the wafer substrate by removing a portion of the second coating substantially extending into the areas of the wafer substrate removed from each side of the semiconductor device.

28. The method of claim 22, further comprising the step of:

coating a portion of the at least one bond pad of the at least one semiconductor device with a third coating.

29. The method of claim 22, further comprising the step of:

coating the uncovered portion of the at least one bond pad of the at least one semiconductor device and a portion of the first coating on the first side of the wafer substrate adjacent the bond pad with a third coating.

30. The method of claim 29, further comprising the step of:

removing a portion of the third coating located adjacent the at least one bond pad of the at least one semiconductor device located on the wafer substrate.

31. The method of claim 22, further comprising the step of:

separating the semiconductor device from the wafer substrate.

32. The method of claim 22, further comprising the step of:

coating the second side of the wafer substrate with a second coating to substantially seal the second side of the wafer substrate, the second coating substantially extending into the portions of the wafer substrate removed from the sides of the semiconductor device and substantially adhering to the plurality of sides of the at least one semiconductor device formed on the wafer substrate.

33. The method of claim 32, further comprising the steps of:

separating the semiconductor device from the wafer substrate by removing a portion of the second coating substantially extending into the areas of the wafer substrate removed from each side of the semiconductor device; and maintaining a portion of the second coating substantially adhering to the sides of the at least one semiconductor device located on the wafer substrate.

34. A method of making a sealed semiconductor device, said method comprising the steps of:

forming at least one semiconductor device on the first side of a wafer substrate having a first side and second side, the semiconductor device having a plurality of sides and at least one bond pad thereon;

coating the first side of the wafer substrate with a first coating to substantially seal the at least one semiconductor device formed on the first side of the wafer substrate;

removing a portion of the wafer substrate from each side of the at least one semiconductor device formed on the wafer substrate, wherein the removing a portion of the wafer substrate comprises:

etching a portion of the wafer substrate from each side of the at least one semiconductor device formed on the wafer substrate, the portion of the wafer substrate removed from each side of the at least one semiconductor device substantially extending from the second side of the wafer substrate to substantially the first coating on the first side of the wafer substrate;

coating the second side of the wafer substrate, the coating comprising a resist coating; and applying a third coating to the second side of the wafer substrate.

35. The method of claim 34, further comprising the step of:

prior to coating the second side of the wafer substrate with a second coating the wafer substrate is thinned.

36. The method of claim 34, further comprising the step of:

removing the second coating of resist from the second side of the wafer substrate.

37. The method of claim 34, wherein the third coating is a coating of glass.

38. The method of claim 34, further comprising the step of:

applying a fourth coating of resist to the first side of the wafer substrate.

39. The method of claim 38, further comprising the step of:

etching substantially the first coating on the first side of the wafer substrate in selected areas of the wafer substrate.

40. The method of claim 39, further comprising the step of:

removing the fourth coating of resist on the first side of the wafer substrate after etching substantially the first coating on the first side of the wafer substrate in the selected areas of the wafer substrate.

41. The method of claim 40, further comprising the step of:

applying a fifth coating to the first side of the wafer substrate.

42. The method of claim 41, wherein the fifth coating comprises a metal coating.

43. The method of claim 41, further comprising the step of:

applying a sixth coating to the first side of the wafer substrate.

44. The method of claim 43, wherein the sixth coating is a resist.

45. The method of claim 43, further comprising the step of:

etching portions of the fifth coating on the first side of the wafer substrate thereby leaving portions of the fifth coating on the first side of the wafer substrate in predetermined areas of the wafer substrate.

46. The method of claim 45, further comprising the step of:

removing substantially the sixth coating from the first side of the wafer substrate thereby uncovering predetermined portions of the fifth coating on the first side of the wafer substrate.

47. The method of claim 46, further comprising the step of:

dividing the wafer substrate into semiconductor devices.

48. The method of claim 46, wherein the step of dividing the wafer substrate comprises:

sawing the wafer into semiconductor devices.

* * * * *